US009431503B2

(12) United States Patent
Lin et al.

(10) Patent No.: US 9,431,503 B2
(45) Date of Patent: Aug. 30, 2016

(54) INTEGRATING TRANSISTORS WITH DIFFERENT POLY-SILICON HEIGHTS ON THE SAME DIE

(71) Applicant: Cypress Semiconductor Corporation, San Jose, CA (US)

(72) Inventors: Chuan Lin, Cupertino, CA (US); Hidehiko Shiraiwa, San Jose, CA (US); Bradley Marc Davis, Mountain View, CA (US); Lei Xue, Milpitas, CA (US); Simon S. Chan, Saratoga, CA (US); Kenichi Ohtsuka, Sunnyvale, CA (US); Angela T. Hui, Fremont, CA (US); Scott Allan Bell, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/149,521

(22) Filed: Jan. 7, 2014

(65) Prior Publication Data
US 2014/0117435 A1    May 1, 2014

Related U.S. Application Data

(62) Division of application No. 13/071,385, filed on Mar. 24, 2011, now Pat. No. 8,652,907.

(51) Int. Cl.
*H01L 29/49*      (2006.01)
*H01L 21/8234*   (2006.01)
*H01L 29/78*      (2006.01)
*H01L 27/115*    (2006.01)
*H01L 21/28*      (2006.01)

(52) U.S. Cl.
CPC ... *H01L 29/4916* (2013.01); *H01L 21/823456* (2013.01); *H01L 27/11546* (2013.01); *H01L 29/78* (2013.01); *H01L 21/28044* (2013.01); *H01L 27/11543* (2013.01)

(58) Field of Classification Search
CPC .................................................... H01L 29/4916
USPC ................................................... 257/327, 392
See application file for complete search history.

(56) References Cited

U.S. PATENT DOCUMENTS

| 5,908,311 | A  * | 6/1999 | Chi et al. ........................ 438/258 |
| 6,818,504 | B2 * | 11/2004 | Rabkin et al. ................ 438/257 |
| 8,652,907 | B2  | 2/2014 | Lin et al. |
| 2005/0189579 | A1 * | 9/2005 | Adachi et al. ................ 257/314 |
| 2006/0019446 | A1 * | 1/2006 | Yang ............................. 438/257 |

(Continued)

OTHER PUBLICATIONS

Non-Final Office Action for U.S. Appl. No. 13/071,385, mailed Dec. 13, 2012; 10 pages.
Final Office Action for U.S. Appl. No. 13/071,385, mailed Apr. 26, 2013; 15 pages.
Non-Final Office Action for U.S. Appl. No. 13/071,385, mailed Jul. 23, 2013; 12 pages.

(Continued)

*Primary Examiner* — Christine Enad

(57) ABSTRACT

An integrated circuit comprises a first poly-silicon region including a first poly-silicon layer, a second poly-silicon layer disposed over the first poly-silicon layer, a first poly-silicon finger associated with the first poly-silicon layer, and a second poly-silicon finger associated with the second poly-silicon layer. The first poly-silicon finger and the second poly-silicon finger are oriented in a substantially orthogonal manner relative to each other. The integrated circuit comprises a second poly-silicon gate region including the first poly-silicon layer. The first polysilicon gate region and the second polysilicon gate region each have different poly-silicon gate structures.

10 Claims, 14 Drawing Sheets

(56) References Cited

U.S. PATENT DOCUMENTS

| | | | |
|---|---|---|---|
| 2008/0090351 A1* | 4/2008 | Mokhlesi et al. ............ 438/257 |
| 2010/0038692 A1* | 2/2010 | Chuang et al. ............... 257/298 |
| 2010/0289064 A1* | 11/2010 | Or-Bach et al. ............. 257/209 |
| 2011/0153055 A1 | 6/2011 | Sheu et al. |
| 2011/0233643 A1* | 9/2011 | Chang .......................... 257/319 |
| 2012/0241871 A1 | 9/2012 | Lin et al. |

OTHER PUBLICATIONS

Notice of Allowance for U.S. Appl. No. 13/071,385, mailed Oct. 9, 2013; 7 pages.

U.S. Appl. No. 13/071,385: "Integrating Transistors With Different Poly-Silicon Heights on the Same Die," Chuan Lin et al., filed on Mar. 24, 2011; 36 pages.

* cited by examiner

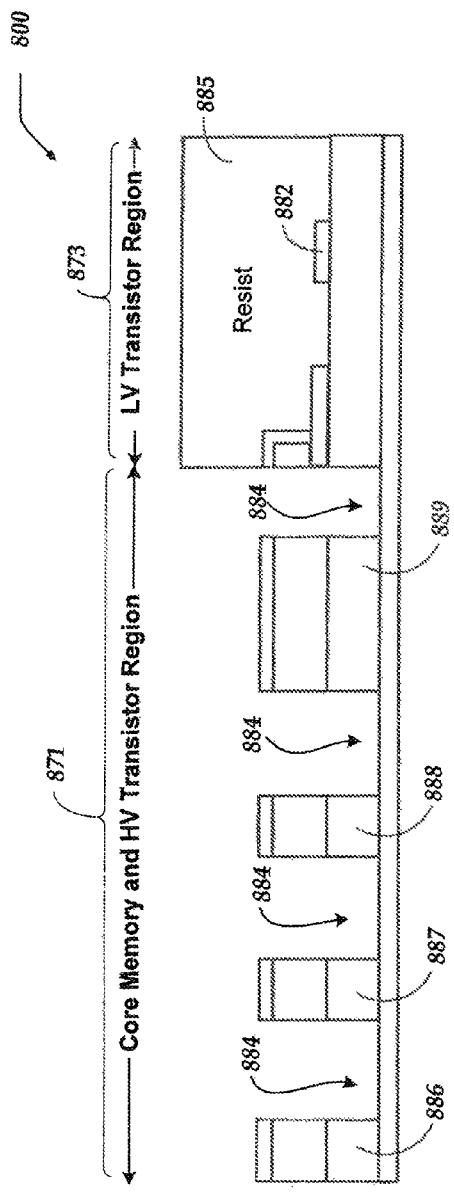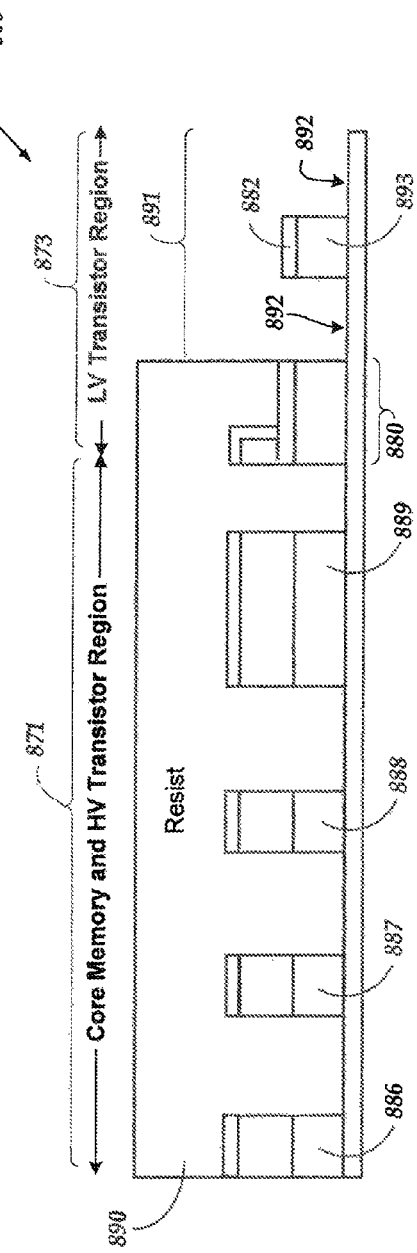

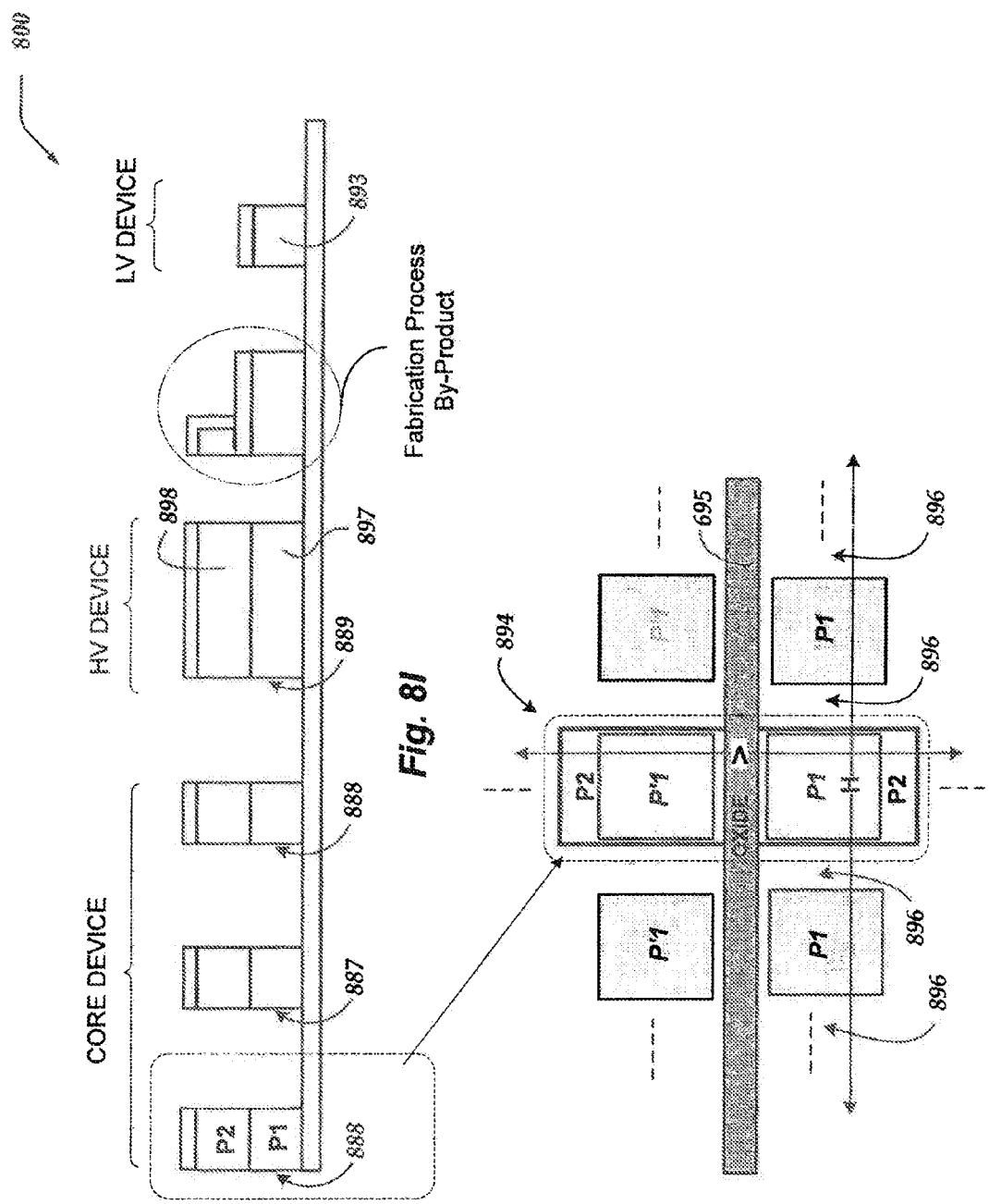

INTEGRATING TRANSISTORS WITH DIFFERENT POLY-SILICON HEIGHTS ON THE SAME DIE

This application is a divisional of U.S. patent application Ser. No. 13/071,385 filed Mar. 24, 2011, the disclosure of which is incorporated by reference herein in its entirety.

TECHNICAL FIELD

The invention is related to computer-readable memory, and in particular, but not exclusively, to a method of fabricating integrated devices.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, whereas EPROM is inexpensive and denser but is not easily erased. "Flash" EEPROM, or Flash memory, however, combines the advantages of these two memory types.

For example, Flash memory may be utilized in both the electronics of larger products such as vehicles and industrial control systems, and within smaller electronic devices such as laptop computers, digital camera/camcorders, digital recording equipment, portable digital assistants (PDAs), portable music players, cell phones, etc.

BRIEF DESCRIPTION OF THE DRAWINGS

Non-limiting and non-exhaustive embodiments of the present invention are described with reference to the following drawings, in which:

FIGS. 8A-8I illustrate embodiments of portions of a Flash memory device at various stages of the fabrication process described in FIG. 7 according to an embodiment of the present invention.

DETAILED DESCRIPTION

Figure 1:
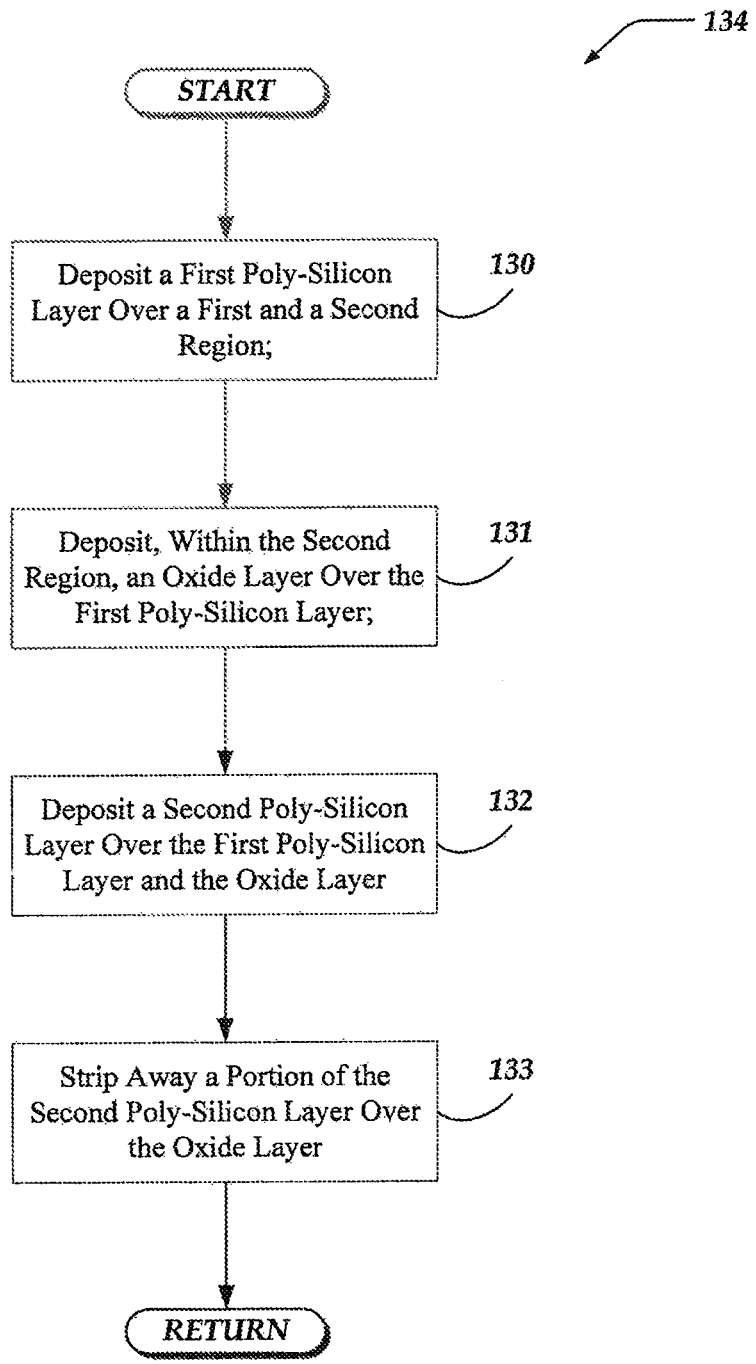
FIG. 1 illustrates a flow diagram of a fabrication process according to an embodiment of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected or an indirect connection through one or more passive or active intermediary devices. The term "signal" means at least one current, voltage, charge, temperature, data, or other signal.

Briefly stated, embodiments are directed towards embedded Flash applications, which includes, among other things, the integration of advanced logic with Flash memory cell technologies. For example, this integration may include the fabrication, on a single die, of Flash core memory and high-voltage (HV) transistors for providing the Flash memory portion along with low-voltage (LV) transistors utilized for implementing the advanced logic functionality. In one embodiment, two different poly-silicon layers may be fabricated in order to produce height differences between the poly-silicon structures of the Flash and advanced logic portions that are produced on the same die.

General Operation

FIG. 1 illustrates a flow diagram of a fabrication process for generating poly-silicon layers of different heights according to an embodiment of the present invention. In one embodiment, process 134 may be employed during Flash memory fabrication. In some embodiments, process 134 may be preceded by other semiconductor die fabrication processes. For example, in one embodiment of a Flash memory fabrication process, process 134 may be preceded by fabrication processes to create shallow trench formations, well formations, tunnel oxide, a charge trap layer, ultra-high voltage gate oxidation, high-voltage gate oxidation, and low-voltage gate oxidation.

In any event, process 134 begins, after a start block, at step 130, where a first poly-silicon layer is deposited over a first region and a second region. In one embodiment, the first poly-silicon layer may have a thickness of about 1000 Å (Angstroms). In another embodiment, the first poly-silicon layer may have a thickness of about 500-1000 Å. In yet another embodiment, the first poly-silicon layer may have any other suitable thickness. In some embodiments, the first region may refer to non-contiguous portions of a semiconductor die. For example, in some embodiments of a Flash memory environment, a first region may include high-voltage transistors and core memory transistors, where the high-voltage transistors may be noncontiguous to the core memory transistors. Similarly, in some embodiments, the first region may be noncontiguous to the second region on the die.

Process 134 then proceeds to step 131, where an oxide layer is deposited over the first poly-silicon layer within the second region. In some embodiments, an oxide layer may be deposited over the first poly-silicon layer. In one embodiment, the oxide layer may have a thickness of between 50-200 Å. In some embodiments, the oxide layer may be an oxide-nitride-oxide (ONO) layer. Further, in one embodiment, an etch resist layer may be deposited over the oxide layer and lithographically patterned using a mask. As a result, a designated portion of the etch resist layer protects a portion of the oxide layer associated with the second region of the die from being etched away. Subsequently, in some embodiments, the oxide layer corresponding to the first region may be etched down to the upper-surface of the first poly-silicon layer.

Continuing to step 132, a second poly-silicon layer is deposited over the first region and the second region, such that the second poly-silicon layer is deposited over the first poly-silicon layer and the oxide layer. In some embodiments, the second poly-silicon layer may have a thickness of about 1000 Å (Angstroms). In another embodiment, the second poly-silicon layer may have a thickness of about 500-1000 Å. In yet other embodiments, the second poly-silicon layer may have any other suitable thickness.

Process 134 then proceeds to step 133, where a portion of the second poly-silicon layer over the oxide layer is stripped away, i.e. the second region. In some embodiments, the second poly-silicon layer may be etched away using a second mask and photolithography. Thus, in one embodiment, a portion of the second poly-silicon layer may be protected by a resist layer patterned during the second masking and photolithography stage. As a result, etching may be limited to removing a portion of the second poly-silicon layer, while leaving the oxide layer and first poly-silicon layer intact over the second region.

Figure 2A:
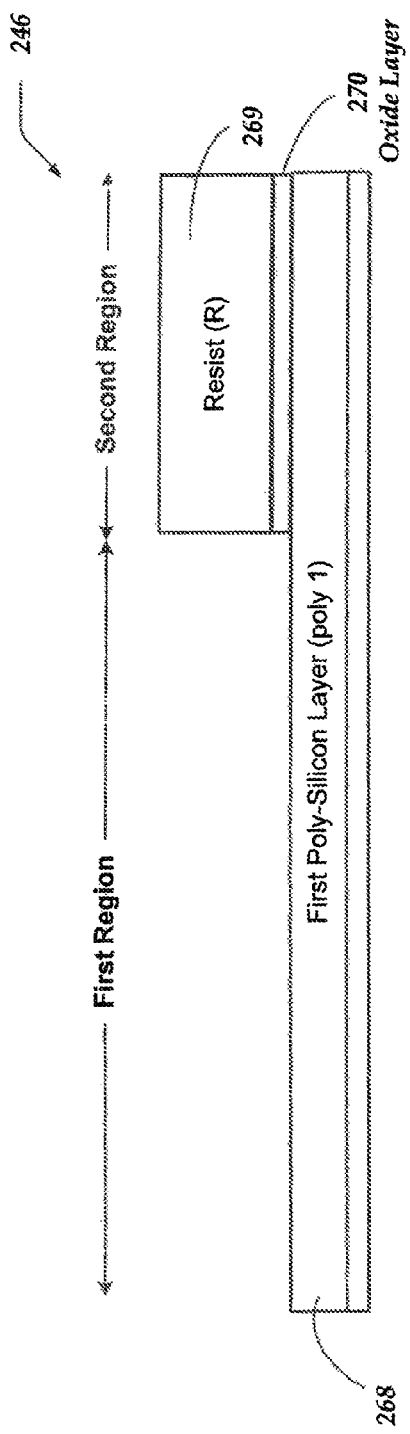
FIGS. 2A-2C illustrate semiconductor structures at various stages of the fabrication process described in FIG. 1 according to an embodiment of the present invention.
Figure 2B:
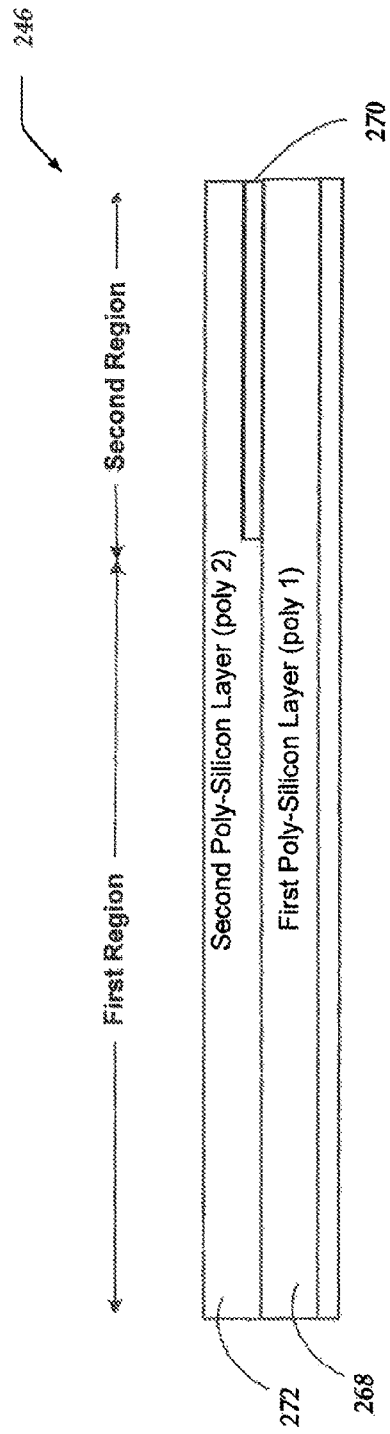
Figure 2C:
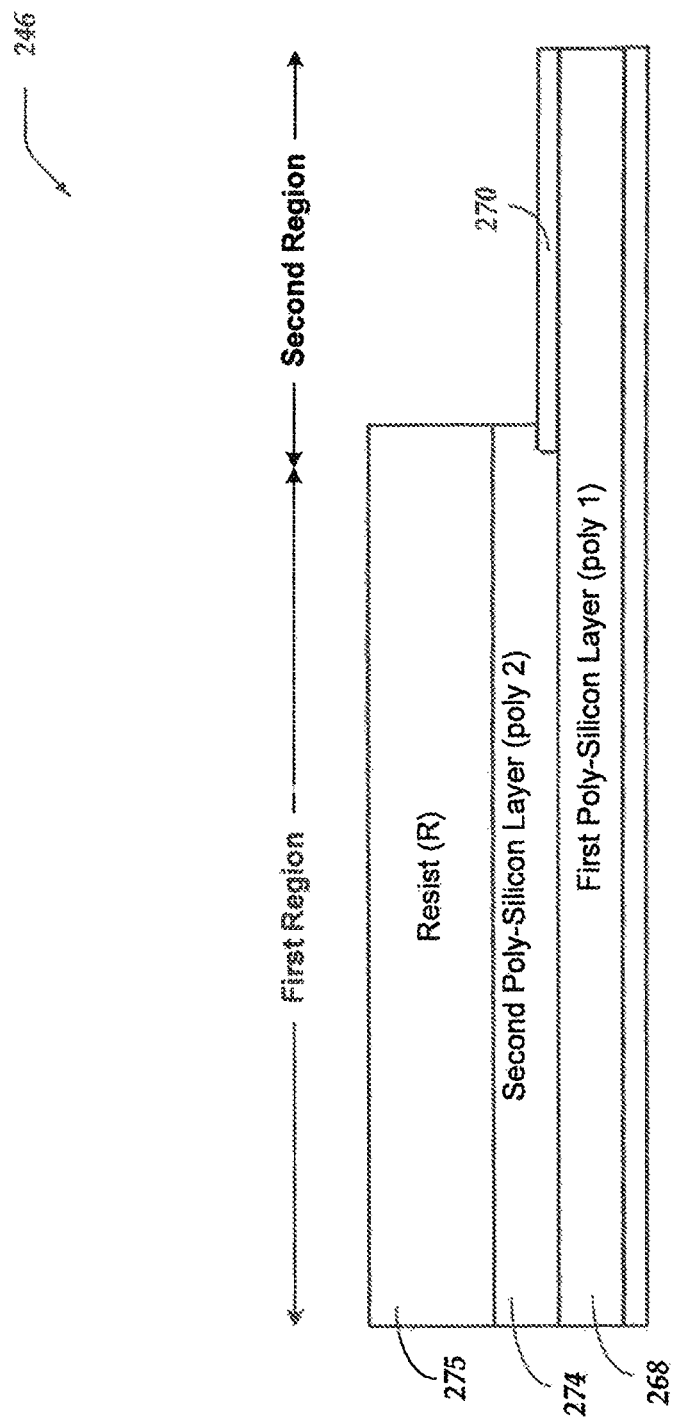

FIGS. 2A-2C illustrate a cross-sectional view of an embodiment of semiconductor device 246 in fabrication, such as by implementing fabrication process 134 of FIG. 1. Although FIGS. 2A-2C illustrate the first region and the second region as contiguous, the invention is not so limited; rather, in some embodiments, the first region may be non-contiguous to the second region. Similarly, in some embodiments, the first region may refer to non-contiguous portions of a semiconductor die. For example, in some embodiments of a Flash memory environment, a first region may include high-voltage transistors and core memory transistors, where the high-voltage transistors may be noncontiguous to the core memory transistors.

FIG. 2A illustrates a cross-sectional view of semiconductor device 246 after step 130 and step 131 of process 134 of FIG. 1 have been performed. Semiconductor device 246 includes a first region, a second region, first poly-silicon layer 268, resist 269, and oxide layer 270.

FIG. 2B illustrates a cross-sectional view of semiconductor device 246 after step 132 of process 134 of FIG. 1 has been performed. Semiconductor device 246 includes a first region, a second region, first poly-silicon layer 268, second poly-silicon layer 272, and oxide layer 270.

FIG. 2C illustrates a cross-sectional view of semiconductor device 246 after step 132 of process 134 of FIG. 1 has been performed. Semiconductor device 246 includes a first region, a second region, first poly-silicon layer 268, portions of second poly-silicon layer 274, resist layer 275, and oxide layer 270.

Example Memory Environment

Figure 3:
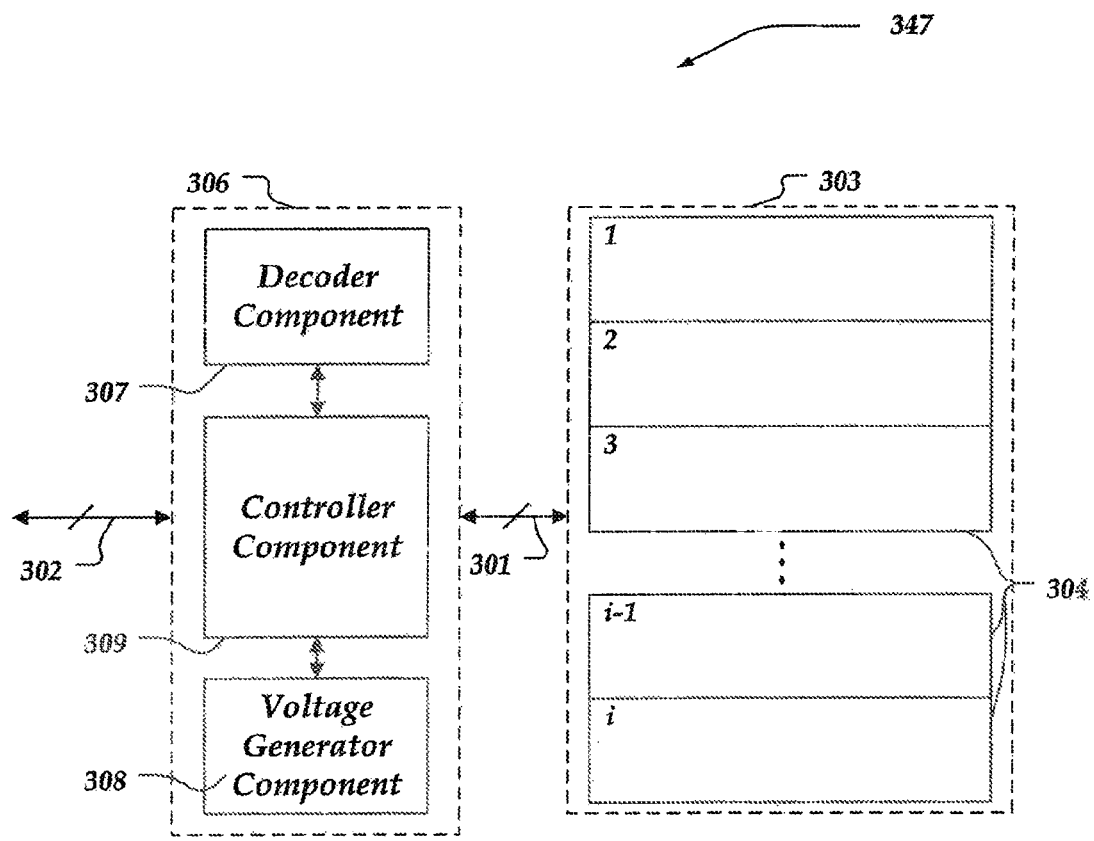
FIG. 3 illustrates a block diagram of an embodiment of a memory.

FIG. 3 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention are described in the context of a MirrorBit™ NOR Flash memory, the fabrication described herein may be employed in manufacturing other types of microelectronic memories or devices such as other various types of Flash memory.

As shown, memory 347 includes arrayed memory 303 and memory controller 306. Memory controller 306 is arranged to communicate addressing data and program data over signal path 302. For example, signal path 302 can provide 8, 16, or more I/O lines of data. Memory controller 306 is also configured to access arrayed memory 303 over signal path 301. For example, memory controller 306 can read, write, erase, and perform other operations at portions of arrayed memory 303 via signal path 301. In addition, although shown as single lines, signal path 301 and/or signal path 302 may be distributed across a plurality of signal lines and/or bus lines.

Arrayed memory 303 includes memory sectors 304 (identified individually as sectors 1-i) that can be accessed via memory controller 306. Memory sectors 304 can include, for example, 256, 512, 1024, 2048 or more sectors having memory cells that can be individually or collectively accessed. In other examples, the number and/or arrangement of memory sectors can be different. In one embodiment, for example, sectors 304 can be referred to more generally as memory blocks and/or can be configured to have a configuration that is different than a bit line, word line, and/or sector topology.

Memory controller 306 includes decoder component 307, voltage generator component 308, and controller component 309. In some embodiments, memory controller 306 may be located on the same chip as arrayed memory 303. In other examples, other implementations of memory controller 306 are possible. For example, memory controller 306 can include a programmable microcontroller.

Decoder component 307 is arranged to receive memory addresses via addressing signal path 302 and to select individual sectors, arrays, or cells according to the architecture of arrayed memory 303.

Decoder component 307 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 303 and another portion (or another grouping of bits) can identify a core cell array within a particular sector.

Voltage generator component 308 is arranged to receive one or more supply voltages (not shown) and to provide a variety of reference voltages required for reading, writing, erasing, pre-programming, soft programming, and/or under-erase verifying operations. For example, voltage generator component 308 can include one or more cascode circuits, amplifier circuits, regulator circuits, and/or switch circuits that can be controlled by controller component 309.

Controller component 309 is arranged to coordinate reading, writing, erasing, and other operations of memory 347. In one embodiment, controller component 309 is arranged to receive and transmit data from an upstream system controller (not shown). Such a system controller can include, for example, a processor and a static random access memory (SRAM) that can be loaded with executable processor instructions for communicating over signal path 302. In another embodiment, controller component 109 as well as other portions of memory controller 306 may be embedded or otherwise incorporated into a system controller or a portion of a system controller.

Embodiments of controller component 309 can include a state machine and/or comparator circuits. State machine and comparator circuits can include any of a variety of circuits for invoking any of a myriad of algorithms for performing reading, writing, erasing, or other operations of memory 347. State machines and comparator circuits can also include, for example, comparators, amplifier circuits, sense amplifiers, combinational logic, or the like.

In some embodiments, memory 347 is a Flash-based memory including Flash-based memory cells, such as Flash-based NOR cells, NAND cells, or hybrids of the two. In some embodiments, memory 347 is a MirrorBit™ Flash memory.

Figure 4:
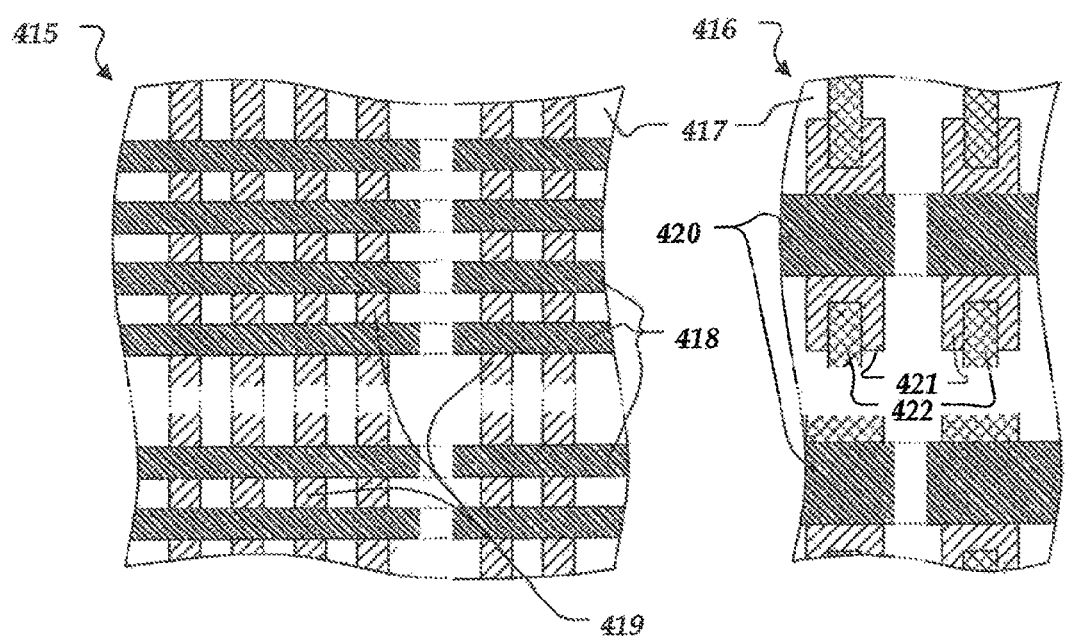
FIG. 4 shows a partial top plan view of an embodiment of core and peripheral sections of a memory that may be employed in the memory of FIG. 3.

FIG. 4 shows a partial top plan view of separate sections of a memory. Core section 415, for example, may be an embodiment of a portion of sector 304 of FIG. 3 and may include arrayed core memory cells. Peripheral section 416, for example, may be an embodiment of memory controller 306 of FIG. 3 or a portion of memory controller 306 of FIG. 3.

Core section 415 includes core poly-silicon lines 418, conductive regions 419, and a portion of substrate 417. Portions of core poly-silicon lines 418 are coupled to the gates of individual memory cells (not shown in FIG. 4) and can be configured as a word line, a source select gate line, and/or a drain select gate line. Portions of conductive regions 419 can include, for example, p-type and/or n-type doped regions of substrate 417 for forming source/drain regions and/or conductive lines. For example, conductive regions 419 can form portions of bit lines and/or other signal lines. Also, in some embodiments, individual conductive regions 419 extend at least partially underneath individual core poly-silicon lines 418.

In one embodiment, core section 415 is arranged in a NOR topology, and individual memory cells can be individually accessed via individual conductive regions 419. In another embodiment, core section 415 is arranged in a NAND topology, and individual memory cells can be accessed though individual conductive regions 419 collectively but not individually. To other embodiments, hybrid architectures can be employed. For example, core section 415 can be configured to have a portion that is NAND-based and another portion that is NOR-based. Also, although not shown in FIG. 4, core section 415 may include any of a variety of interconnect and/or passivation layers, such as dielectric, conductive, or other layers. For example, conductive regions 419 can be positioned beneath a dielectric spacer layer.

Peripheral section 416 includes peripheral poly-silicon lines 420, conductive regions 421, and interconnects 422. Portions of peripheral poly-silicon lines 420 are coupled to individual peripheral devices (not shown in FIG. 4).

Portions of conductive regions 421 can include, for example, p-type and/or n-type doped regions of substrate 417 for forming conductive features, such as a source, a drain, or other type of well. Interconnects 422 can include conductive lines that electrically intercouple portions of peripheral section 416 and/or electrically couple core section 415 with peripheral section 416. For example, interconnects 422 can include a combination of metal lines and vias. Also, although not shown FIG. 4, peripheral section 416 may also include any of a variety of other interconnect and/or passivation layers.

Figure 5:
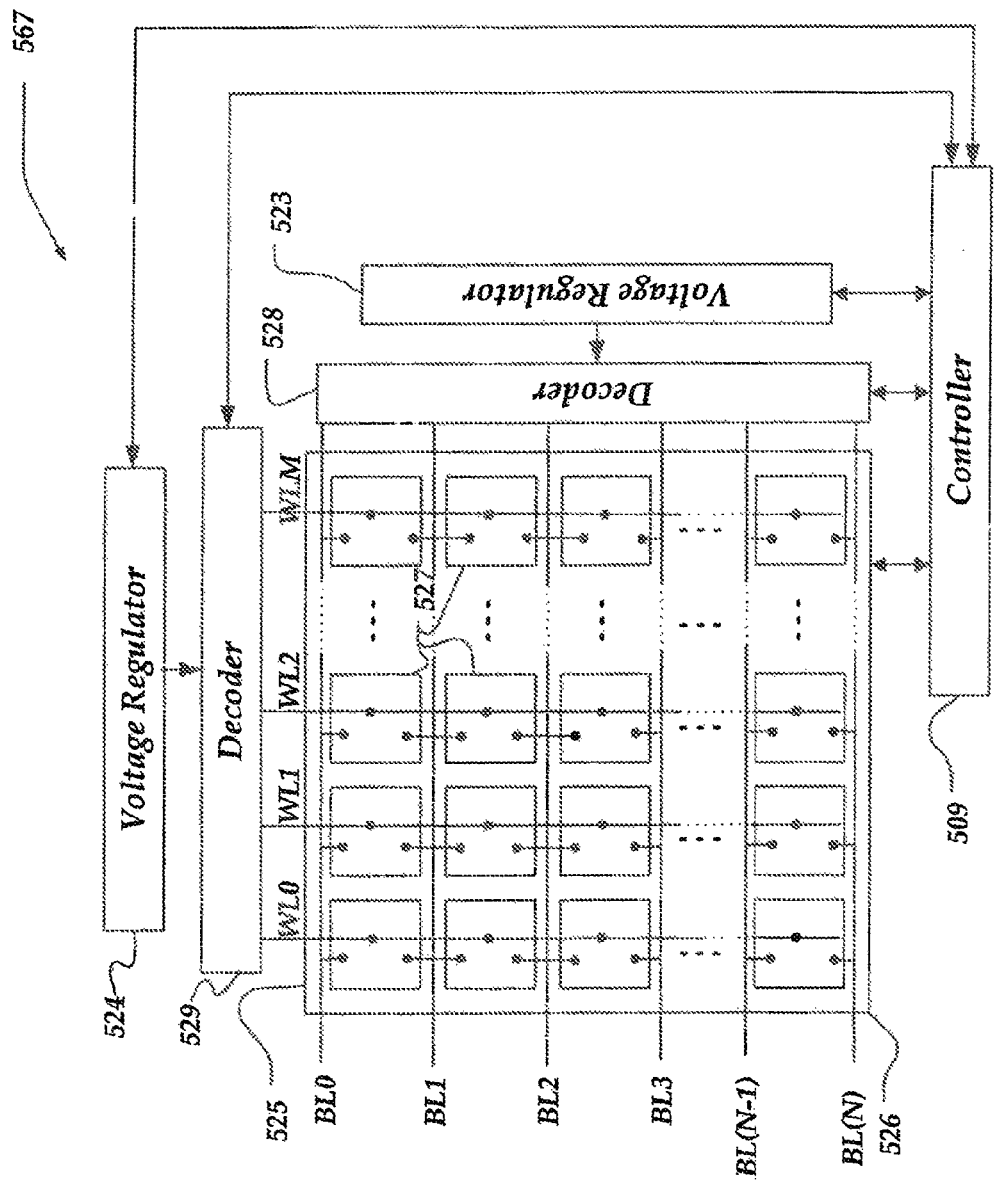
FIG. 5 illustrates a block diagram of an embodiment of a NOR memory array.

FIG. 5 illustrates a block diagram of an embodiment of memory device 567, which may be employed as an embodiment of memory device 347 of FIG. 3. Memory device 567 includes memory array 526 and individual memory cells 527 located within memory array 526. Memory cells 527 are arranged in N+1 rows and M+1 columns in memory array 526. In one embodiment, each row of memory array 526 is accessed by two of the bit lines BL0 to BLN. Each column of memory array 526 is accessed by one of word lines WL0 to WLM. Accordingly, each of memory cells 527 can be accessed by activating the corresponding bit lines and a corresponding word line of the cell. In one embodiment, each column of memory array 526 defines a data word. If N+1 has a value of 8, for example, the cells in each column of memory array 526 define a byte of data.

Memory cells 527 may be Flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, Flash memory stores information in an array of memory cells made from floating-gate transistors. In, for example, a NOR gate Flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("VT") of the cell. The threshold voltage of a MOSFET is usually defined as the gate voltage where an inversion layer forms at the interface between the insulating layer (oxide), and the substrate (body) of the transistor. During read-out, a voltage is applied to the CG, and the MOSFET channel will become conducting or remain insulating, depending on the VT of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). In contrast, multi-level cell ("MLC") devices can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the Flash devices.

Memory device 567 further includes controller 509, decoder 528, decoder 529, voltage regulator 523, and voltage regulator 524.

Decoder 528 and decoder 529 can each receive address bus information from controller 509 and can utilize such information to facilitate accessing or selecting the desired memory cell(s) (e.g., memory location(s)) associated with the command, and to provide the needed voltages to the bit lines (decoder 528) and the word lines (decoder 529) according to timing that is controlled by controller 509.

Decoder 528 may also include a sector decoder in some embodiments. As such, decoder 509 may be arranged to facilitate accessing or selection particular column or grouping of columns within memory device 567. For example, a grouping of columns may define a sector, and another grouping of columns may define another sector. In another embodiment, portion 501 may include an array decoder for to a particular memory array 525. In addition, embodiments of array decoders can be configured to work separately or in conjunction with a sector decoder.

In some embodiments, decoders such as decoder 528 and decoder 529 may each receive a boosted voltage, which may be received at the gates of one of more transistors in the decoders. These transistors may be referred to as high-voltage (HV) transistors or HV devices due to the boosted voltage that the HV transistors receive at their respective gates. HV transistors may be used in bit line decoding, word line decoding, sector decoding, array decoding, and/or the like. In contrast, logic in the periphery section of the Flash memory includes transistors that have gates that receive voltages that are not boosted. These transistors may be referred to as low-voltage (LV) transistors or LV devices. For example, controller 509 may include high-performance logic that includes LV transistors. The HV devices, LV devices, and core memory cells have different requirements, including different poly heights.

Memory controller 509 is also configured to control the activation and de-activation of individual word lines WL0 to WLM for reading, writing, and/or erasing to memory array 526. For example, memory controller 510 can provide a select signal to decoder 529 to select one of the columns WL1 to WLM to activate that column. Further, memory controller 536 can provide a select signal to decoder 528 for selecting particular rows BL0 to BLN (or sector) to be written to or read from.

Figure 6:
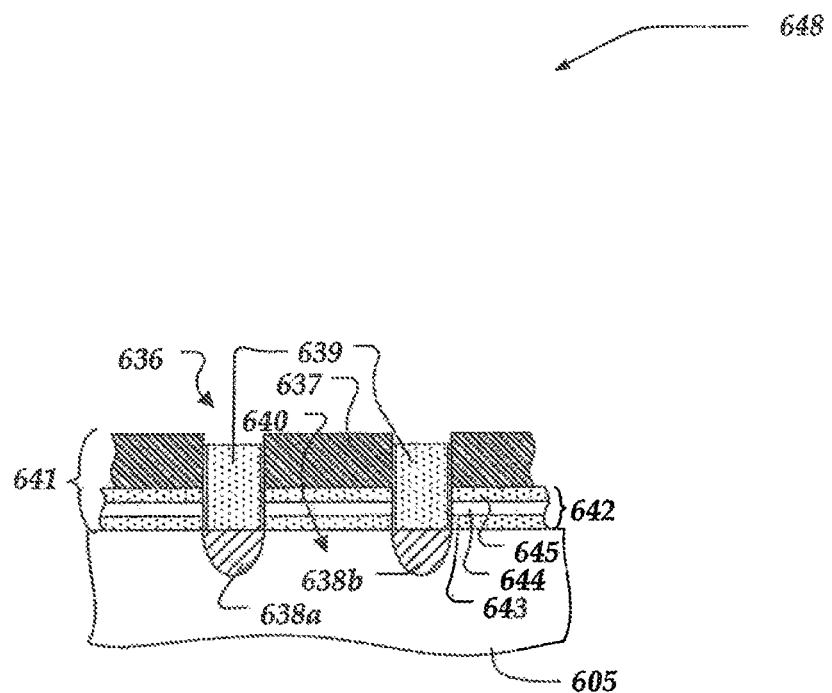
FIG. 6 shows a cross-sectional side view of an embodiment of a core section of FIG. 4.

FIG. 6 shows a cross-sectional side view of a memory cell in core section 648. In one embodiment, core section 648 is an embodiment of core section 415 of FIG. 4.

Memory cell 636 includes a portion of substrate 605, dielectric spacer layer 639, channel region 640, source/drain regions 638a and 638b, and layered stack 641, including charge trapping component 642 and a portion of core poly-silicon line 637. Substrate 605 may be an embodiment of substrate 417 of FIG. 4. Source/drain regions 638a and 638b may be an embodiment of one or more conductive regions 419 of FIG. 4. Core poly-silicon line 637 may be an embodiment of an individual core poly-silicon line 418 of FIG. 4.

In operation, core poly-silicon line 637 and source/drain regions 638a and 638b are configured to provide electrical potential(s) to memory cell 636 for trapping charge at charge trapping component 642. A bit is "programmed" when it is trapping a charge and "unprogrammed" when it is not trapping charge. To trap charge, charge trapping component 642 employs tunneling layer 643, charge trapping layer 644, and dielectric layer 645. In general, tunneling layer 643 provides a tunneling barrier, charge trapping layer 644 is a layer that is configured to store charge, and dielectric layer 645 electrically isolates charge trapping layer 644 from core poly-silicon line 637. In one embodiment, memory cell 636 is a one bit memory cell that is configured to store up to two logic states. In another embodiment, memory cell 636 can store more than two logic (or bit) states.

In some embodiments, charge trapping component 642 is an oxide-nitride-oxide (ONO) layer in which dielectric layer 645 is an oxide (such as silicon dioxide), charge trapping layer 644 is a nitride, and tunneling layer 643 is an oxide (such as silicon dioxide). In one embodiment in which charge trapping layer 644 is a nitride, charge trapping layer 644 may be a silicon-rich nitride (SiRN) or a stoichiometric silicon nitride. Dielectric spacer layer 639 may be a nitride spacer, an oxide-nitride spacer, other type of spacer composed of one or more dielectric materials, or the like.

Modern semiconductor devices are typically created as integrated circuits manufactured on the surface of a substrate of semiconductor material, which is typically a wafer formed by slicing a single crystal ingot growth by a Czochralski process. Various devices are formed on the wafer using a series of steps that include deposition, removal processes (such as etching), patterning, and doping. Few steps or many hundreds of such steps may be used in various designs. The patterning steps may be performed by photo-lithography or other lithographic methods. For example, the wafer may be coated with a photoresist, which is exposed, with a device that transmits light through a photomask, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design, which may be stored in a machine-readable medium. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Illustrative Embodiment

Figure 7:
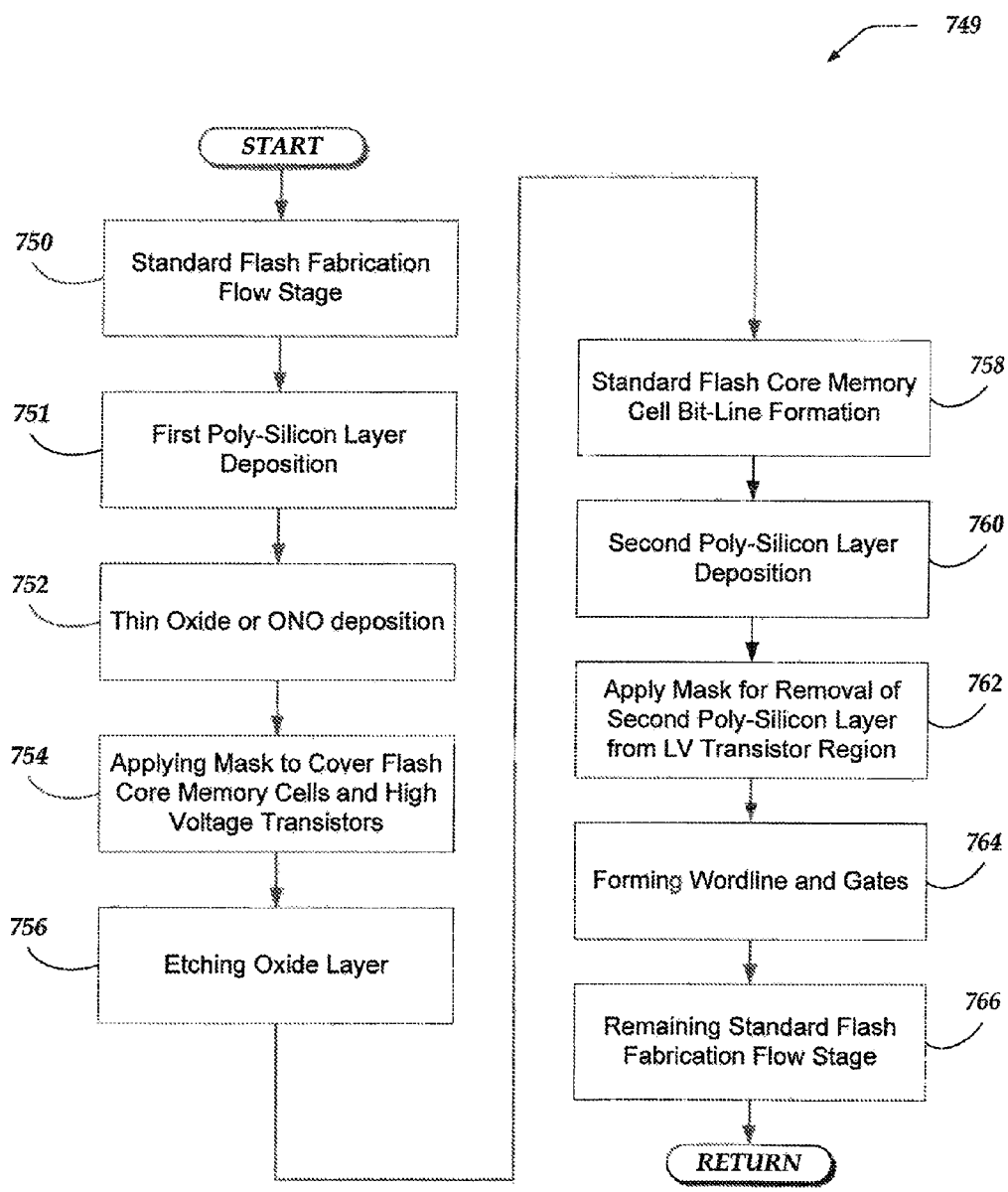
FIG. 7 illustrates a flow diagram of a Flash memory fabrication process according to an embodiment of the present invention.

FIG. 7 illustrates a flow diagram of a fabrication process for generating poly-silicon layers of different heights according to an embodiment of the present invention. Various steps associated with process 749 of FIG. 7 will be described with the aid of FIGS. 8A-8I. FIGS. 8A-8I illustrate a cross-sectional view of portions of an embodiment of Flash memory device 800, in fabrication that includes, for example, a first region (i.e. a Flash memory region) comprising at least one HV transistor and/or at least one core memory transistor, and a second region (i.e., an advanced and/or complex logic device region) comprising at least one LV transistor.

Process 749 may begin, after a start block, at step 750, where a standard Flash fabrication process creates shallow trench formations, well formations, tunnel oxide, a charge trap layer, ultra-high voltage gate oxidation, high-voltage gate oxidation, and low-voltage gate oxidation on the same semiconductor die.

Figure 8A:
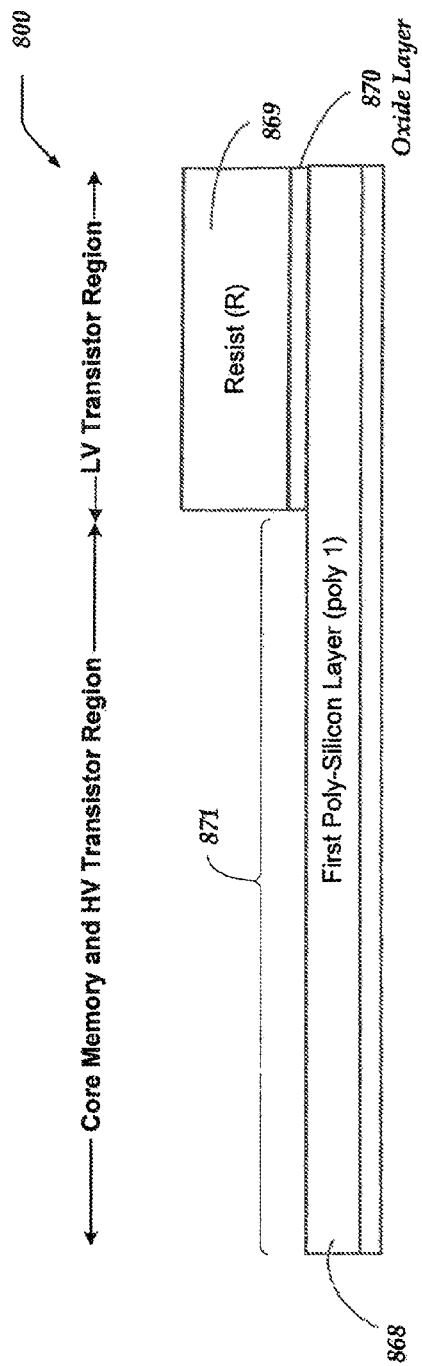

Process 749 then proceeds to steps 751. Steps 751, 752, 754, and 756 will now be described with the aid of FIG. 8A. In one embodiment, FIG. 8A illustrates portions of Flash memory device 800 in fabrication. At step 751, once these structural elements are fabricated (step 750), a first layer of poly-silicon 868 having a thickness of about 1000 Å (Angstroms) is deposited. Proceeding next to step 752, an oxide layer of between 50-200 Å is deposited over the poly-silicon layer 868. Process 749 then proceeds to step 754, where an etch resist layer is then deposited over the oxide layer and lithographically patterned using a mask. As a result, a designated portion of the etch resist layer 869 protects a portion of the oxide layer 870 associated with the LV transistor region of the die from being etched away. Continuing to step 756, the remaining portion of oxide layer corresponding to the HV and core memory transistor region, as designated by 871, are etched down to the upper-surface of the first layer of poly-silicon 868. Next, at step 758, the bit-lines associated with the core memory transistors are formed.

Figure 8B:
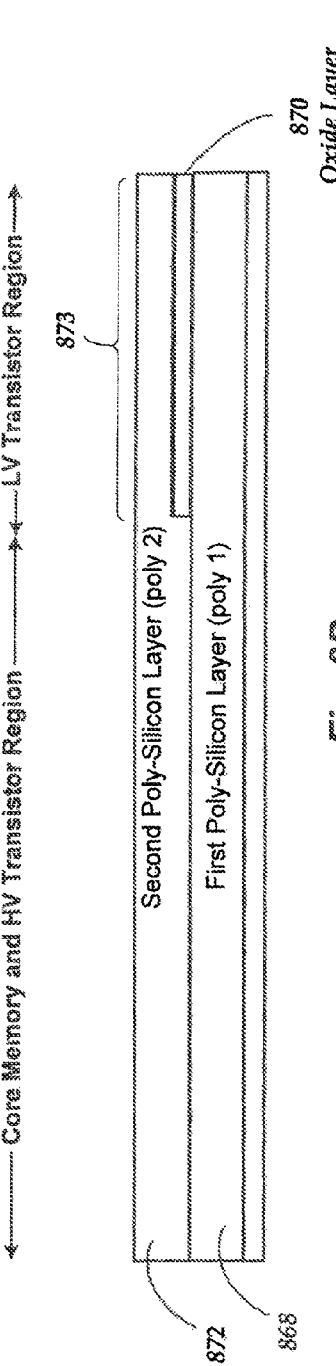

Process 749 then proceeds to step 760, where a second layer of poly-silicon 872 also having a thickness of about 1000 Å (Angstroms) is deposited over both the first layer of poly-silicon 868 and the oxide layer 870, which is illustrated in FIG. 8B.

Figure 8C:
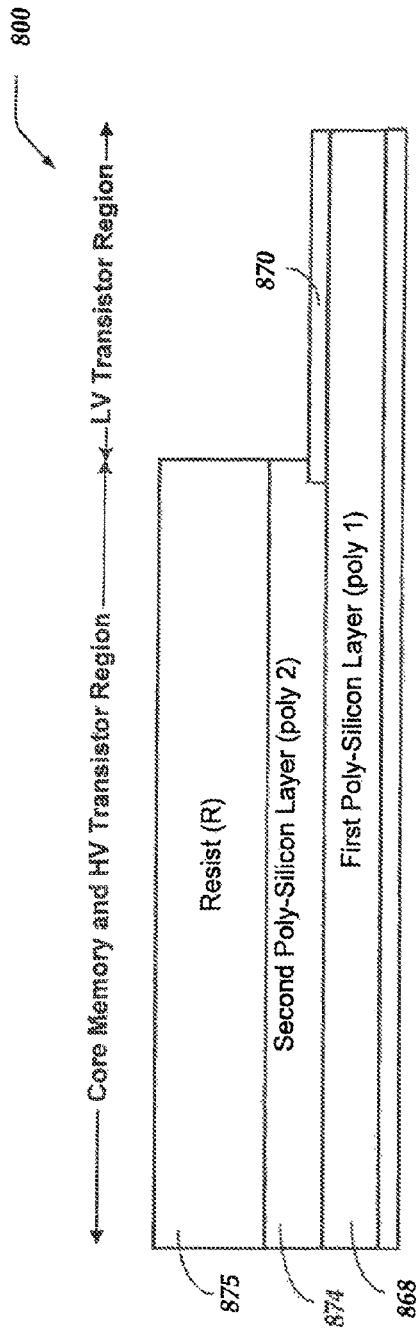

Proceeding to step 762, as illustrated in FIG. 8C, the portion (FIG. 8B) of the second layer of poly-silicon 872 that is deposited over the LV transistor region 873 of the die is etched away using a second mask and photolithography. Thus, portion 874 of the second layer of poly-silicon 872 remains protected by the resist layer 875 patterned during the second masking and photolithography stage. As shown, the etching is limited to removing a portion 873 (FIG. 8B) of the second layer of poly-silicon 872, while leaving the entire first layer of poly-silicon 868 intact.

Figure 8D:
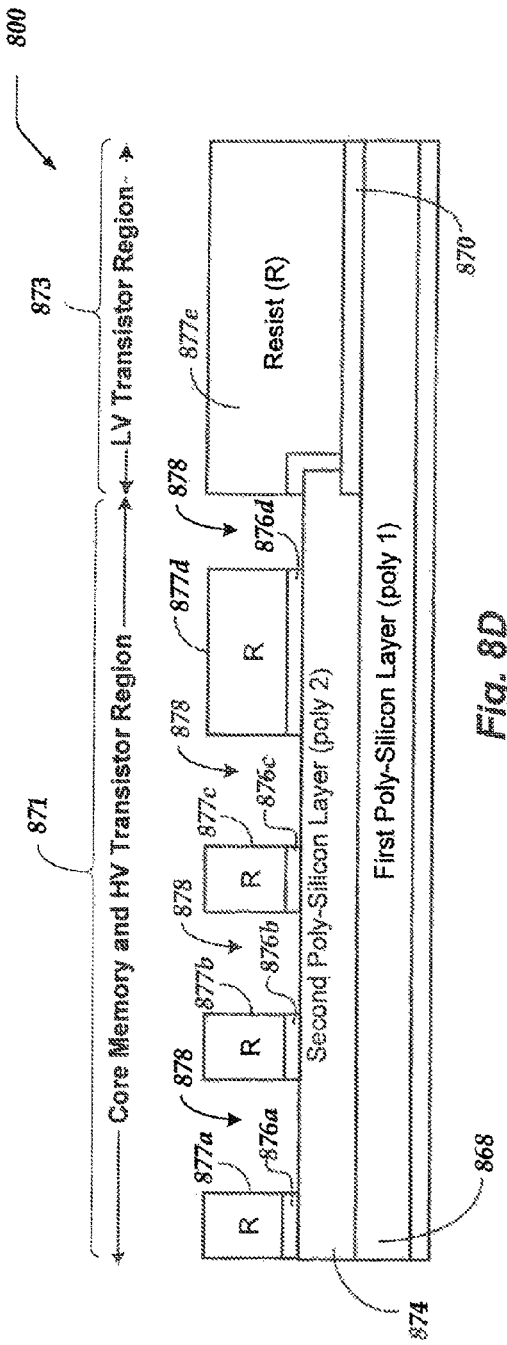
Figure 8E:
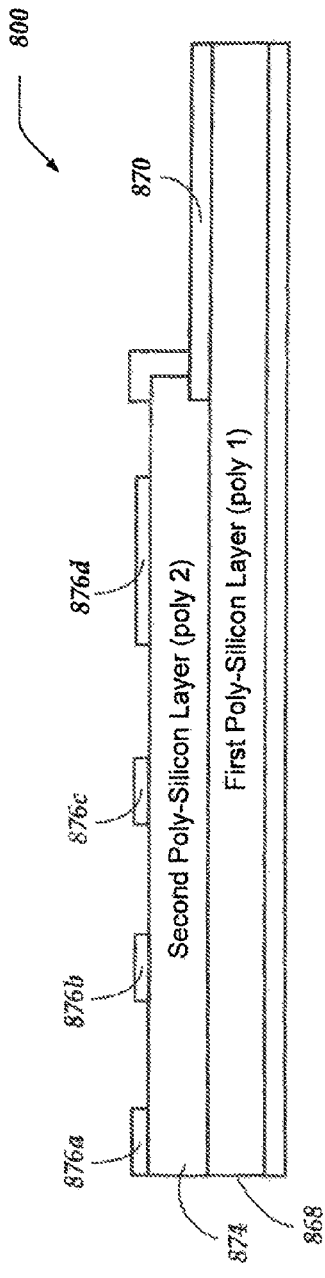

Process 749 next proceeds to step 764, where word-lines and gates are formed on the core memory, HV, and LV transistors, as illustrated in FIGS. 8D-8I. Referring to FIG. 8D, an oxide hard cover mask process is used to generate oxide regions 876a-876d over portion 874 of the second poly-silicon layer. A core memory/HV gate mask is then used to pattern (over the oxide regions) the gate structures used for the transistor devices within the HV and core memory region 871 of the die. Therefore, as a result of this patterning, resist regions 877a-877c cover the generated oxide regions 876a-876c of the core memory gate structures, respectively, and deposited resist region 877d is deposited over the generated oxide region 876d of the HV transistor gate structure. In addition, resist region 877e covers the entire LV transistor region 873. A hard mask etch process then strips away the resist regions 878 that were not patterned during the core memory/HV gate mask. As illustrated in FIG. 8E, a hard mask etch is utilized to strip away the remaining resist regions 877a-877e shown in FIG. 8D.

Figure 8F:
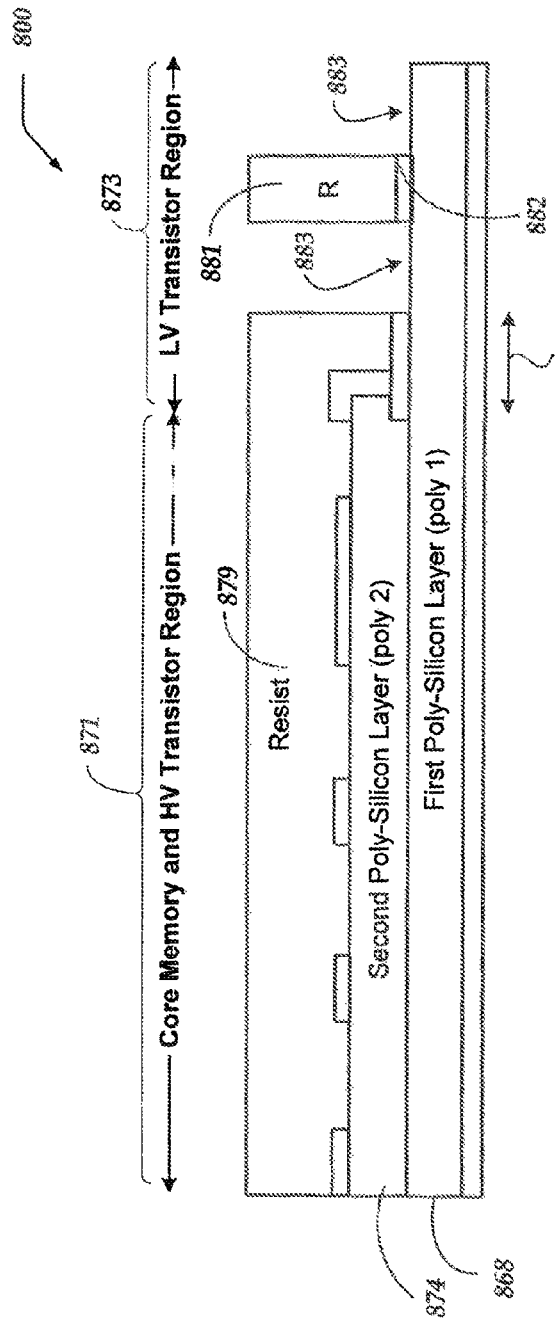

As shown in FIG. 8F, an LV gate mask is used to pattern the gate structure for the LV transistor device within a portion of the LV region 871 of the die. Thus, as a result of this patterning, resist region 879 covers the HV and core memory region 871 and, in some embodiments, a relatively small interface (between the HV/core memory region and LV transistor region) portion 880 of the LV transistor region 873. In addition, resist region 881 covers an oxide region 882 corresponding, to the gate structure of the LV transistor. Accordingly, upon a hard mask etching process, regions 883 of oxide region 870 (FIG. 8E) are stripped away, while the remaining HV and core memory structures are protected by resist region 879.

As shown in FIG. 8G, once the etch resist region 881 (FIG. 8F) is stripped away from the gate structure of the LV transistor, the oxide region 882 remains. A resist layer is then deposited over the entire device and patterned in order to remove portions of the first and second layers of poly-silicon 868, 874 (FIG. 8F). Accordingly, based on the patterning of the resist layer, during etching, regions 884 of the first and second layers of poly-silicon 868, 874 are stripped away from the HV and core memory region 871. Thus, poly-silicon structures 886, 887, and 888 form the gate and word-lines of the core memory transistors, while poly-silicon structure 889 forms the gate of the HV transistor. Also, during this etching process, resist region 885 protects the oxide region 882 within the LV transistor region 873.

As shown in FIG. 8H, once the etch resist region 885 (FIG. 8G) is stripped away from the LV transistor region 873, another resist layer 890 is deposited over the entire device and patterned in order to now remove portions of the first and second layers of poly-silicon 868, 874 (FIG. 8F) associated with the LV transistor region 873. After such patterning, resist layer 890 protects the HV and core memory region 871, and the relatively small interface portion 880 of the LV transistor region 873. However, within the remaining portion 891 of the LV transistor region 873, regions 892 of the first layer of poly-silicon 868 are stripped away in order to create poly-silicon structure 893, which forms an LV transistor gate. During the etching of regions 892 of the poly-silicon 868, oxide 882 acts as a natural etch stop. As illustrated in FIG. 8I, following the etching process, resist layer 890 is stripped away leaving a structure that includes a semiconductor device structure having poly-silicon gate structures of different heights, which depend on each particular transistor's functionality and structure.

As previously described, LV transistors may include short channels for facilitating high-speed operations. Thus, as a result of the short-channel construction, fabricating gate structures of an increased height may lead to several instabilities, such as gate collapse. As illustrated by portions of Flash memory device 800 in fabrication in FIG. 8I, the poly-silicon structure 893 of the LV transistor gate is formed from a portion of a single poly-silicon layer such as layer 868. In contrast to the LV transistor devices, the core memory and HV transistors include poly-silicon gate structures that are formed from multiple poly-silicon layers in order facilitate the application of higher voltages during operation. For example, as illustrated in FIG. 8I, the poly-silicon structures 886, 887, 888, 889 forming the gate structures of both the core memory and HV transistors are formed from a portion of multiple poly-silicon layers such as layers 868 and 874.

Poly-silicon structures 886, 887, and 888 correspond to the gate regions of the core memory transistor devices and poly-silicon structure 889 forms the gate region of the HV transistor. As designated at 894, a slightly blow-up plan view of poly-silicon structure 886 is shown. As illustrated, the gate region of device 886 includes poly-silicon fingers P1 and P2. Poly-silicon finger P2, which is fabricated from the second layer of poly-silicon 674 (e.g., FIG. 8C), runs in an orthogonal direction (V) relative to poly-silicon finger P1 running horizontally in the direction of arrow (H). The gaps between adjacent poly-silicon fingers P1 and P'1 in the vertical (V) direction are filled with oxide 895 of the same thickness as the poly-silicon fingers P1. Thus, when poly-silicon finger P2 is laid over poly-silicon fingers P1 and P'1, the poly-silicon material corresponding to poly-silicon finger P2 does not fill the gaps between poly-silicon fingers P1 and P'1. Poly-silicon finger P1 is fabricated from the first layer of poly-silicon 868 (e.g., FIG. 8C) and overlaps (at least partially) with poly-silicon finger P2, which is laid over poly-silicon finger P1. As further illustrated, some regions 896 of poly-silicon finger P1 are etched away during the etching of the second layer of poly-silicon 874. In poly-silicon structures 886, 887, and 888, poly-silicon finger P1 may include a floating gate structure while poly-silicon finger P2 may form a word-line.

Regarding the poly-silicon structure 889 forming the gate region of the HV transistor, poly-silicon region 897 of the first layer of poly-silicon 868 and poly-silicon region 898 of the second layer of poly-silicon 874 are stacked on top of each other with no interface material between them.

Continuing with step 766 of FIG. 7, once the word-line and gates are formed (step 764), any remaining standard Flash processes are carded out. After step 766, process 749 returns. Although FIG. 7 and FIG. 8 are described with reference to specific embodiments, the invention is not so limited; rather FIG. 7 and FIG. 8 show example embodiments and other suitable embodiments may be employed without departing from the scope and spirit of the invention. Thus, in some embodiments, other suitable semiconductor fabrication embodiments may be employed without departing from the scope and spirit of the invention, in one non-limiting and non-exhaustive example, FIG. 8 describes oxide layer 870 as an oxide; however, in some embodiments, oxide layer 870 may include an oxide-nitride-oxide layer. In another non-limiting and non-exhaustive example, FIG. 7 describes a first layer of poly-silicon having a thickness of about 1000 Å; however, in other embodiments, a first layer of poly-silicon may have another suitable thickness.

Figure 9:
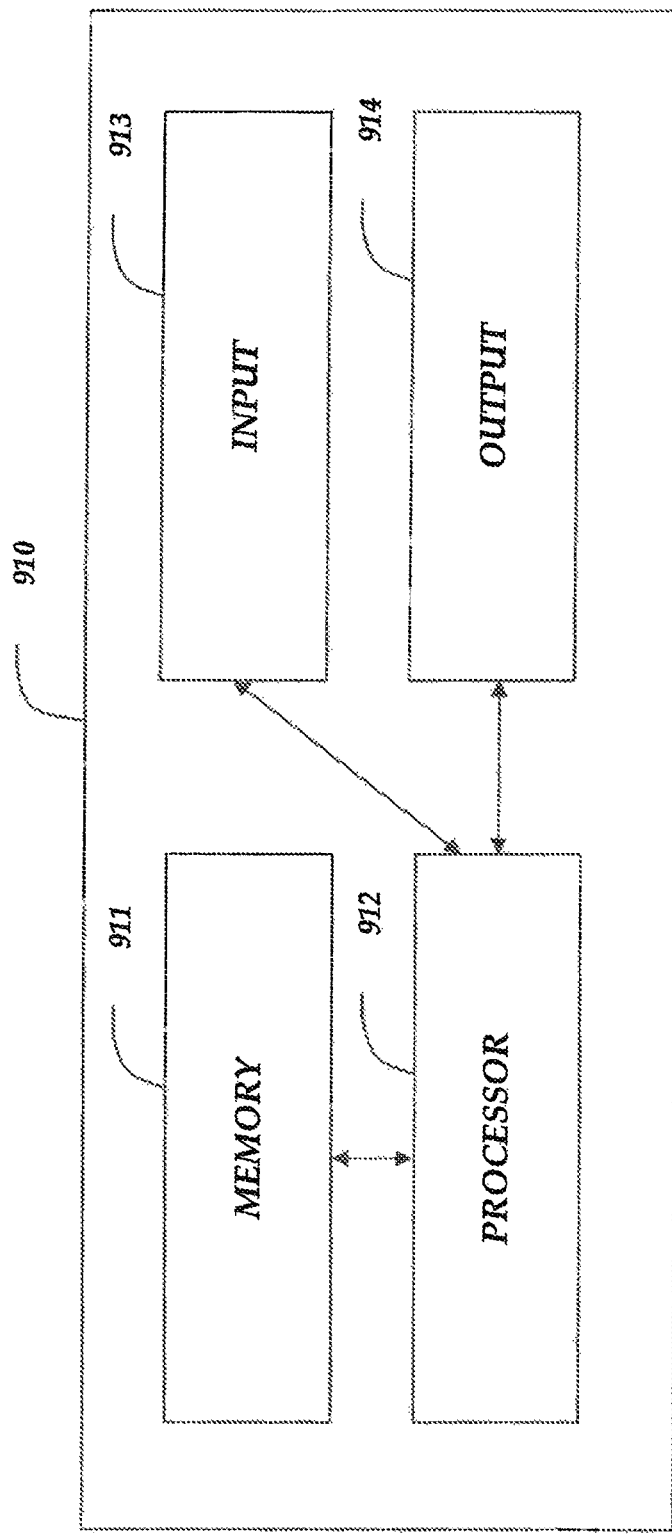
FIG. 9 illustrates a block diagram of an embodiment of a system that includes the memory device of FIG. 3, in accordance with aspects of the invention.

Embodiments of a memory device that employ embodiments of the present invention, such as portions of Flash memory device 800 in FIGS. 8A-8I in fabrication, can be incorporated into any of a variety of components and/or systems, including for example, a processor and other components or systems of such components. FIG. 9 shows one embodiment of system 910, which may incorporate memory 911, which is an embodiment of memory device 347 of FIG. 3. Memory 911 can be directly or indirectly connected to any one of processor 912, input devices 913, and/or output devices 914. In one embodiment, memory 911 may be configured such that it is removable from system 910. In another embodiment, memory 911 may be permanently connected to the components or a portion of the components of system 910.

In many embodiments, memory 911, processor 912, input devices 913, and/or output devices 914 of system 910 are configured in combination to function as part of a larger system. For example, system 910 may be incorporated into a cell phone, a handheld device, a laptop computer, a personal computer, and/or a server device. In addition or alternatively, system 910 can perform any of a variety of processing, controller, and/or data storage functions, such as those associated with sensing, imaging, computing, or other functions. Accordingly, system 910 can be incorporated into any of a wide variety of devices that may employ such functions (e.g., a digital camera, an MP3 player, a GPS unit, and so on).

The above specification, examples and data provide a description of the fabrication processes and structure associated with core Flash memory, HV, and LV transistors integrated within a single die in accordance with the manufacture and use of the composition of the invention. However, it will be appreciated that the methods and structures illustrated and described above may apply to any semiconductor fabrication process involving forming poly-silicon structures of differing heights. Since many embodiments of the invention can be made without departing from the spirit and scope of the invention, the invention also resides in the claims hereinafter appended

What is claimed is:

1. An integrated circuit, comprising: at least one first poly-silicon gate region including a first poly-silicon layer, a second poly-silicon layer disposed over the first poly-silicon layer, a plurality of first poly-silicon fingers associated with the first poly-silicon layer, and at least one second poly-silicon finger associated with the second poly-silicon layer, wherein the plurality of first poly-silicon fingers and the at least one second poly-silicon finger are orientated in a substantially orthogonal manner relative to each other; and wherein a gap between adjacent ones of the first poly-silicon fingers is filled with silicon oxide having a same thickness as a thickness of the first poly-silicon fingers; and at least one second poly-silicon gate region including the first poly-silicon layer, wherein the at least one first poly-silicon gate region and the at least one second poly-silicon gate region each have different poly-silicon gate structures.

2. The integrated circuit of claim 1, wherein the at least one first poly-silicon gate region includes the first poly-silicon layer and the second poly-silicon layer arranged in a stacked configuration.

3. The integrated circuit of claim 1, wherein the at least one first poly-silicon gate region includes at least one high-voltage transistor and at least one Flash memory transistor.

4. The integrated circuit of claim 1, wherein the at least one second polysilicon gate region includes at least one complex logic device, wherein the at least one complex logic device includes at least one low-voltage transistor.

5. The integrated circuit of claim 4, wherein the at least one complex logic device comprises a microprocessor.

6. The integrated circuit of claim 4, wherein the at least one low-voltage transistor comprises a short-channel transistor device.

7. The integrated circuit of claim 1, wherein the at least one second poly-silicon gate region further includes an oxide layer over the first poly-silicon layer.

8. The integrated circuit of claim 1, wherein the first and the second polysilicon layer each have a thickness of about 500-1000 angstroms.

9. The integrated circuit of claim 1, wherein the at least one first poly-silicon gate region includes at least one Flash memory cell, wherein the at least one Flash memory cell includes at least one Flash memory transistor.

10. The integrated circuit of claim 1, further comprising an oxide between the at least one first poly-silicon finger and another adjacent poly-silicon finger.

* * * * *